United States Patent
Lee

(10) Patent No.: US 6,653,180 B2
(45) Date of Patent: Nov. 25, 2003

(54) TRANSISTORS INCLUDING GATE DIELECTRIC LAYERS HAVING DIFFERENT NITROGEN CONCENTRATIONS AND RELATED STRUCTURES

(75) Inventor: Tae-jung Lee, Kyungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/140,711

(22) Filed: May 8, 2002

(65) Prior Publication Data

US 2002/0163011 A1 Nov. 7, 2002

Related U.S. Application Data

(62) Division of application No. 09/358,574, filed on Jul. 21, 1999.

(30) Foreign Application Priority Data

Jul. 21, 1998 (KR) .............................. 98-29290

(51) Int. Cl.$^7$ .............................................. H01L 21/00
(52) U.S. Cl. ...................................... 438/199; 438/798
(58) Field of Search ............................... 257/314, 324, 257/325, 368, 369, 411, 914, E21.267, E21.293, E21.145, E21.192; 438/199, 216, 275, 591, FOR 401, 240, 440, 766, 769, 798

(56) References Cited

U.S. PATENT DOCUMENTS

| | | |
|---|---|---|
| 5,596,218 A | 1/1997 | Soleimani et al. |
| 5,726,087 A | 3/1998 | Tseng et al. |
| 5,861,347 A | 1/1999 | Maiti et al. |
| 5,920,779 A | 7/1999 | Sun et al. |
| 6,048,769 A | 4/2000 | Chau |
| 6,087,236 A * | 7/2000 | Chau et al. .................. 438/301 |

FOREIGN PATENT DOCUMENTS

JP           6005796           1/1994

OTHER PUBLICATIONS

T. Kuroi et al., Nove NICE (Nitrogen Implantation into CMOS Gate Electrode and Source–Drain) Structure for High Reliablity and HIgh Performance 0.25 um Dual Gate CMOS, IEEE, Dec. 1993, pp. 325–328.*

* cited by examiner

Primary Examiner—William David Coleman
(74) Attorney, Agent, or Firm—Myers Bigel Sibley & Sajovec

(57) ABSTRACT

An electronic device on a semiconductor substrate can include first and second field effect transistors on a substrate. In particular, the first field effect transistor includes a first gate dielectric layer having a first nitrogen concentration, and the second field effect transistor includes a second gate dielectric layer having a second nitrogen concentration lower than the first nitrogen concentration. More particularly, the first field effect transistor can be a PMOS transistor, and the second field effect transistor can be an NMOS transistor. Related methods are also discussed.

16 Claims, 9 Drawing Sheets

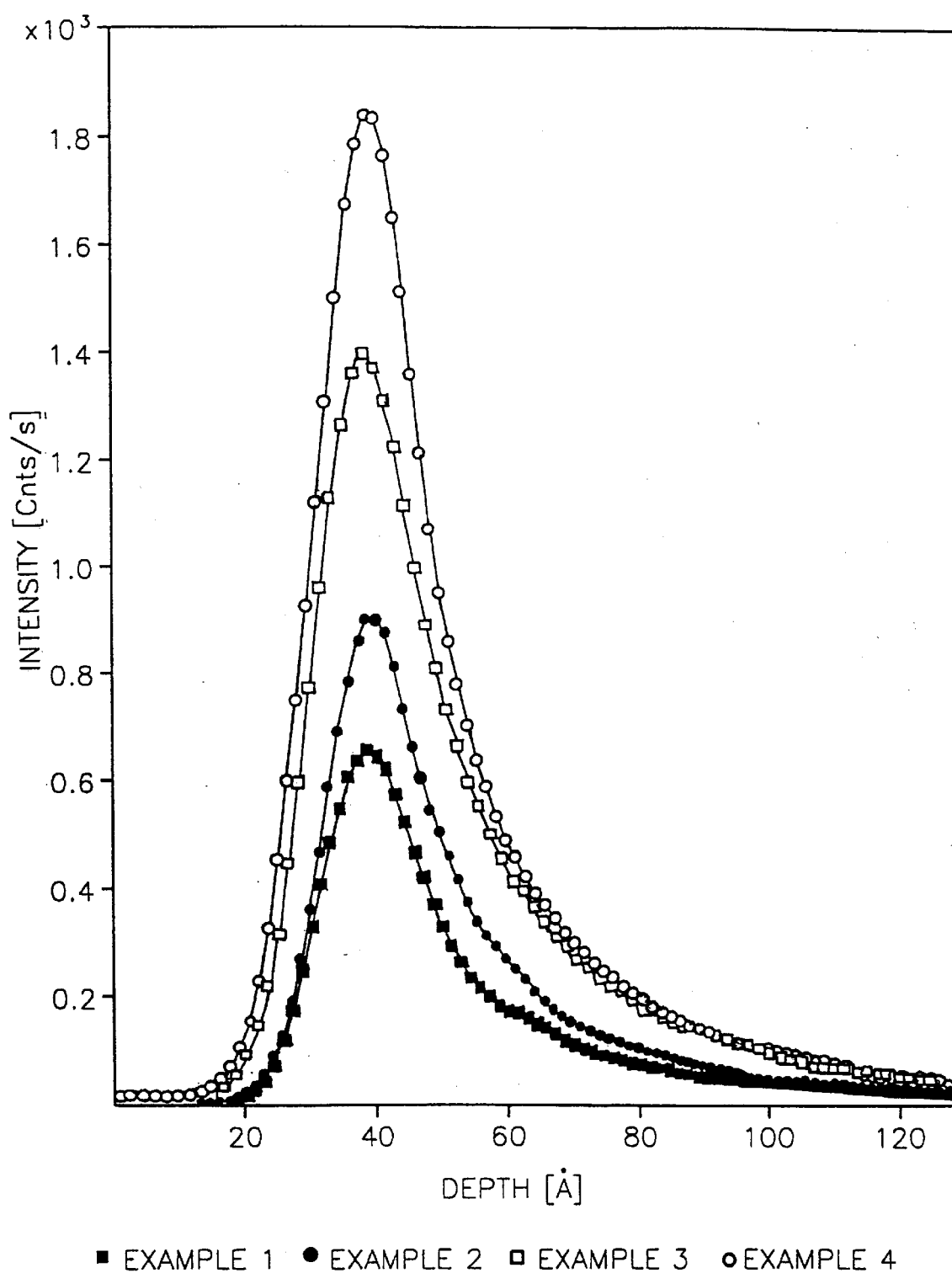

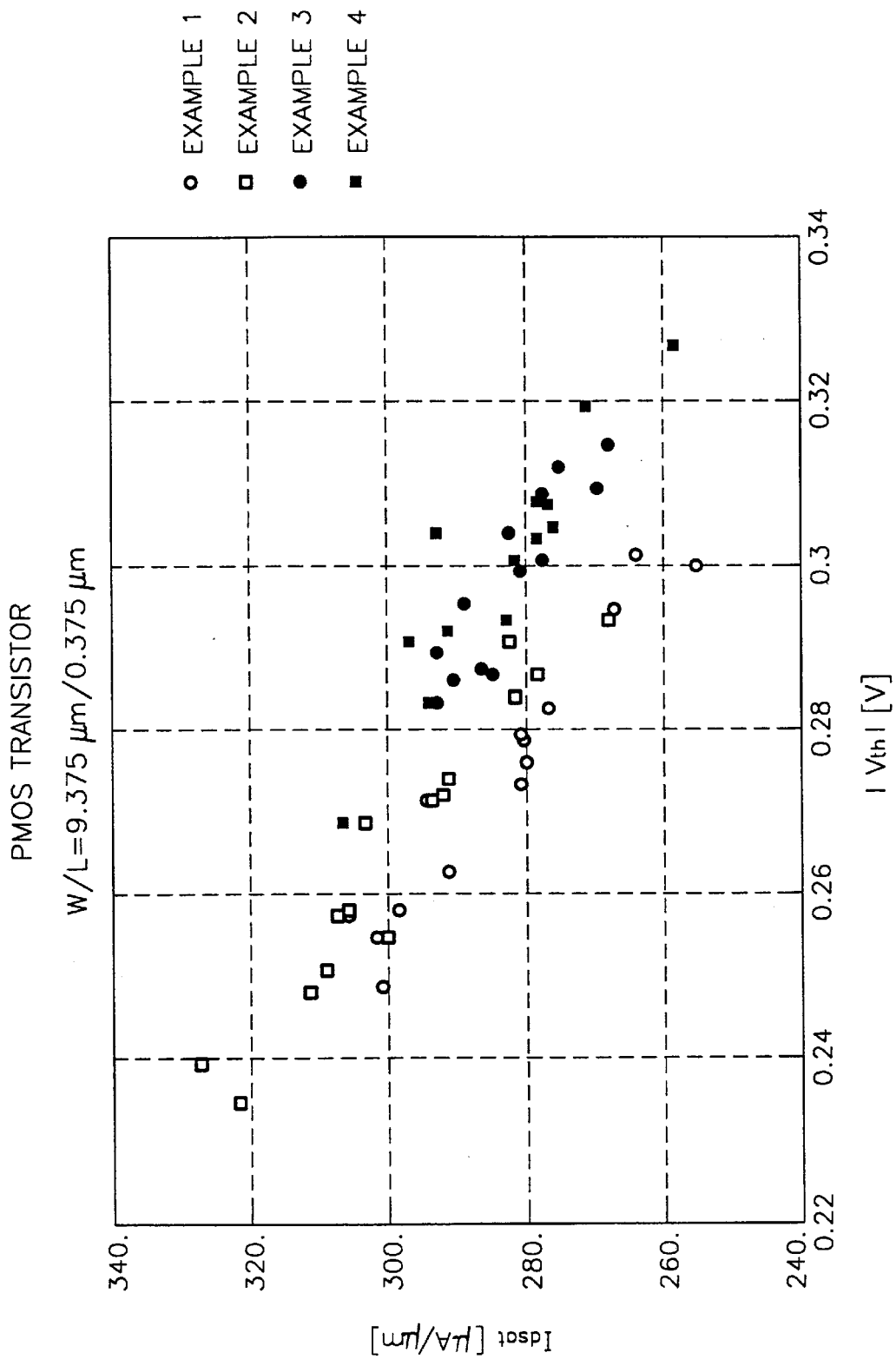

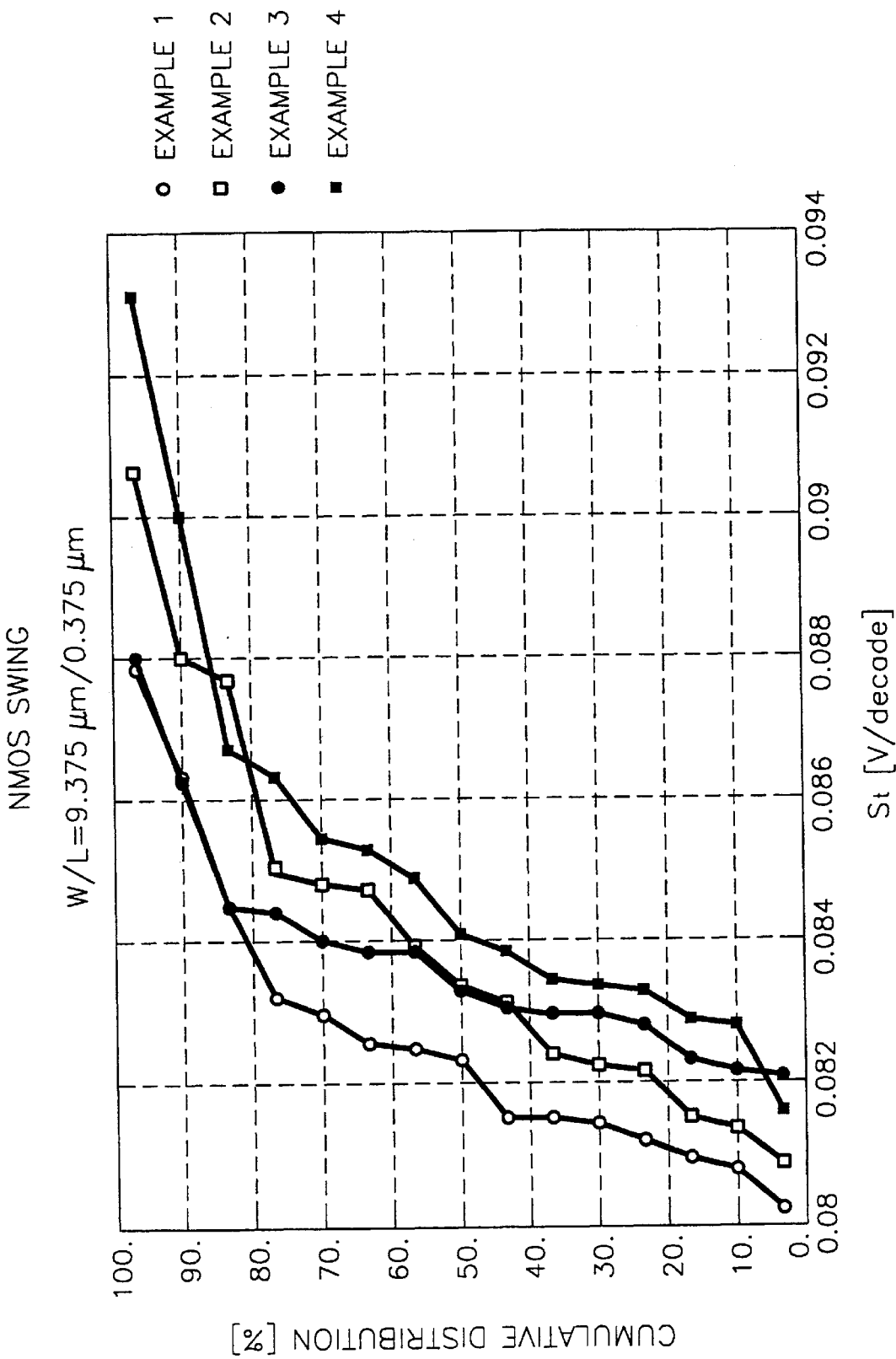

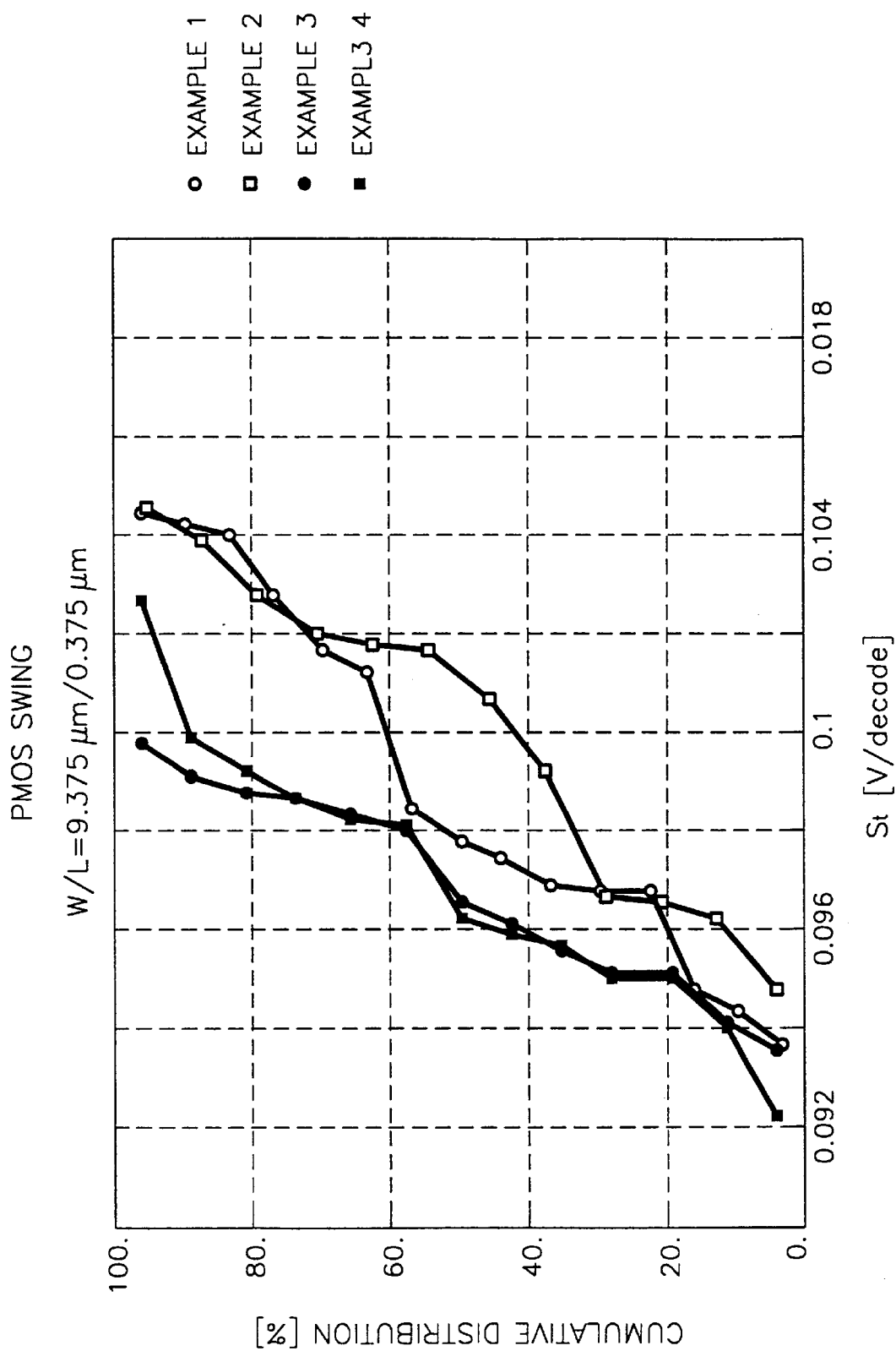

TRANSISTORS INCLUDING GATE DIELECTRIC LAYERS HAVING DIFFERENT NITROGEN CONCENTRATIONS AND RELATED STRUCTURES

RELATED APPLICATIONS

The present application claims priority as a divisional application from U.S. application Ser. No. 09/358,574 filed Jul. 21, 1999. The present Application also claims priority from Korean Application No. 98-29290 filed Jul. 21, 1998. The disclosures of U.S. application Ser. No. 091358,574 and Korean Application No. 98-29290 are hereby incorporated herein in their entirety by reference.

FIELD OF THE INVENTION

The present invention relates to the field of electronics, and more particularly to methods of forming electronic devices including transistors and related structures.

BACKGROUND OF THE INVENTION

As semiconductor devices become more highly integrated, sizes of MOS transistors and distances between source and drain regions generally decrease. Accordingly, gate dielectric films may become more thin to improve control of channel by a gate electrode and to improve operation characteristics of a transistor.

However, as gate dielectric films become thinner, it may be difficult to provide reliability of gate dielectric films. To address this problem, technology for implanting nitrogen into a silicon dioxide layer forming a gate dielectric film has been developed. As an example, U.S. Pat. No. 5,596,218 to Soleimani et al. entitled "Hot Carrier-Hard Gate Oxides by Nitrogen Implantation Before Gate Oxidation" discloses technology for implanting a high concentration of nitrogen atoms at the interface between a silicon substrate and a gate oxide film.

When using an oxide film containing nitrogen as a gate dielectric film, a portion in which dangling bonds between the oxide film and a silicon substrate can be strengthened by a nitrogen atom, thereby improving interface characteristics between a gate dielectric film and a silicon substrate. Also, by virtue of the nitrogen component in the gate dielectric film, penetration of boron from an $n^+$ polysilicon gate electrode into the gate dielectric film can be reduced, and therefore various benefits including suppression of shifting of a threshold voltage level in a PMOS transistor can be expected.

However, in a CMOS transistor where an n-channel metal oxide semiconductor field transistor (MOSFET) and a p-channel MOSFET are coupled, a gate dielectric film containing nitrogen may differently affect performance characteristics and $I_D$-$V_{GS}$ characteristics in a subthreshold region in each of the n-channel MOS (NMOS) device and the p-channel MOS (PMOS) device.

The performance characteristics and the subthreshold characteristics of each of the NMOS transistor and the PMOS transistor comprising gate dielectric films including nitrogen may thus need to be evaluated to form a gate dielectric film capable of providing desired operational characteristics in the NMOS and the PMOS transistors based on the result of the above evaluation.

SUMMARY OF THE INVENTION

It is therefore an object of the present invention to provide methods of forming transistors having improved performance and reliability and related structures.

It is another object of the present invention to provide methods that can allow improved transistors of different conductivity types to be fabricated on a common substrate.

These and other objects can be provided according to the present invention by forming first and second field effect transistors on a substrate. More particularly, the first field effect transistor can include a first gate dielectric layer having a first nitrogen concentration, and the second field effect transistor can include a second gate dielectric layer having a second nitrogen concentration lower than the first nitrogen concentration. The different nitrogen concentrations in the respective dielectric layers can allow improved performance and reliability for transistors of different conductivity types on a common substrate.

For example, the first field effect transistor can define a channel of a first conductivity type, and the second field effect transistor can define a channel of a second conductivity type to provide a complementary metal oxide semiconductor (CMOS) device. More particularly, the first conductivity type can be p-type so that the first transistor can be a PMOS transistor, and the second conductivity type can be n-type so that the second transistor can be an NMOS transistor.

In addition, the steps of forming the first and second transistors can be preceded by the step of forming a nitrogen region having an increased nitrogen concentration along a first surface portion of the substrate and the step of forming the first transistor can include forming the first gate dielectric layer adjacent the nitrogen region. In addition, the second surface portion of the substrate can be maintained free of the nitrogen region, and the step of forming the second transistor can include forming the second gate dielectric layer adjacent the second surface portion of the substrate free of the nitrogen region. Nitrogen from the nitrogen region can thus diffuse into the first gate dielectric layer to provide the higher nitrogen concentration for the first gate dielectric layer.

The step of forming the nitrogen region can include forming a sacrificial layer on the first surface portion of the substrate, and forming a mask layer on a second surface portion of the substrate wherein the mask layer exposes the sacrificial layer on the first surface portion of the substrate. Nitrogen can then be introduced into the first surface portion of the substrate through the sacrificial layer while the nitrogen is blocked from the second surface portion of the substrate by the mask layer. After introducing the nitrogen, the sacrificial layer and the mask layer can be removed. More particularly, the nitrogen can be introduced by implanting nitrogen ions.

According to the present invention, an NMOS transistor of a CMOS device can include a gate dielectric layer having a relatively low concentration of nitrogen, and a PMOS transistor of the CMOS device can include a relatively high concentration of nitrogen. The relatively low concentration of nitrogen in the NMOS transistor gate dielectric layer can strengthen interface characteristics between the NMOS gate dielectric layer and the substrate without significantly affecting the operational characteristics of the NMOS transistor. The relatively high concentration of nitrogen in the PMOS transistor gate dielectric layer can increase the reliability of the PMOS gate dielectric layer.

BRIEF DESCRIPTION OF THE DRAWINGS

The above objectives and advantages of the present invention will become more apparent by describing in detail a preferred embodiment thereof with reference to the attached drawings in which:

FIG. 1 is a graph showing nitrogen intensity as a function of the depth from the upper surface of a gate dielectric film to a silicon substrate for semiconductor devices having gate dielectric films containing various concentrations of nitrogen;

FIGS. 2A and 2B are graphs showing relationships between threshold voltages and saturation currents in NMOS transistors and PMOS transistors, respectively;

FIGS. 4A and 4B are graphs showing cumulative distributions of the subthreshold swings in the NMOS and PMOS transistors.

DETAILED DESCRIPTION

Figure 2A:
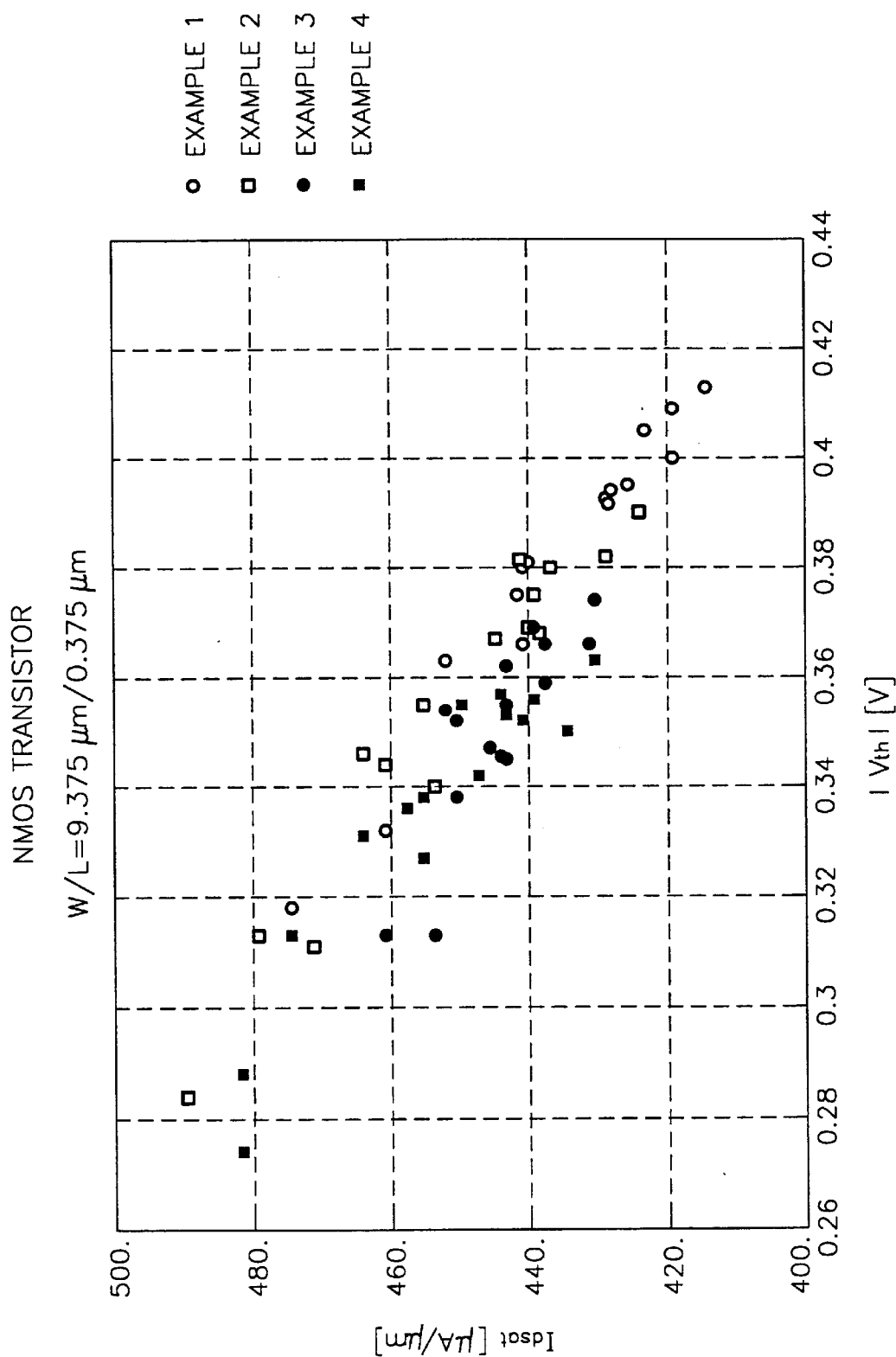

The present invention will now be described more fully herein after with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

In order to evaluate reliability of gate dielectric films each in an NMOS transistor and a PMOS transistor of a CMOS device, there were formed CMOS device samples each having gate dielectric films including oxide layers containing different concentrations of nitrogen.

The samples were classified as Example 1, Example 2, Example 3 and Example 4 according to the conditions for forming the gate dielectric films. Here, the total thickness of the gate dielectric films of each sample was approximately 47 Å. The gate dielectric film of each sample included a first dielectric film formed by oxidation under a pure $O_2$ atmosphere and a second dielectric film formed by oxidation under an $N_2O$ atmosphere. These two films were formed to have respective thicknesses of 44 Å and 3 Å in Example 1, 42 Å and 5 Å in Example 2, 37 Å and 10 Å in Example 3, and 35 Å and 12 Å in Example 4.

FIG. 1 comparatively shows the nitrogen content of each example based on the nitrogen intensity (counts/sample) as a function of the depth from the upper surface of the gate dielectric film to a silicon substrate. From results of FIG. 1, it can be understood that the peaks of the nitrogen intensity in all examples were formed within the respective films at a region near the interface between the gate dielectric film and the silicon substrate. The peak values of the nitrogen intensity in each example are tabulated in Table 1.

TABLE 1

| Classification | thickness of gate dielectric film formed under pure $O_2$ atmosphere (Å) | thickness of gate dielectric film formed under $N_2O$ atmosphere (Å) | nitrogen content at the peak intensity (counts/sample) |
|---|---|---|---|
| Example 1 | 44 | 3 | 0.65 |
| Example 2 | 42 | 5 | 0.88 |
| Example 3 | 37 | 10 | 1.38 |
| Example 4 | 35 | 12 | 1.84 |

As shown in Table 1, as the ratio of the thickness of the gate dielectric film formed under $N_2O$ atmosphere to the total thickness of the gate dielectric films increases, the nitrogen intensity increases. That is, the nitrogen concentration within the gate dielectric films was as follows: Example 1<Example 2<Example 3<Example 4.

FIGS. 2A and 2B show the relationships between a threshold voltage $V_{th}$ and a saturation current $I_{dsat}$ in an NMOS transistor and a PMOS transistor of various samples. Here, width (W) and length (L) of the gate line were 9.375 $\mu$m and 0.375 $\mu$m.

As known from the result of FIGS. 2A and 2B, the threshold voltage $V_{th}$ of the NMOS transistor decreases as the nitrogen concentration in the gate dielectric film increases at a constant saturation current $I_{dsat}$. On the other hand, the threshold voltage $V_{th}$ of the PMOS transistor increases as the nitrogen concentration in the gate dielectric film increases at a constant saturation current $I_{dsat}$.

It can be understood that these results may be caused by the nitrogen atoms in the gate dielectric film acting as donor traps having positive charges. That is, in the case of an NMOS transistor, the threshold voltage $V_{th}$ may be reduced due to donor traps formed by the nitrogen atoms. In a saturation region, the saturation current may not be significantly changed because the electron density may increase in a channel region and electrons in the channel region may be coupled in the donor traps formed by the nitrogen atoms. Thus, the threshold voltage $V_{th}$ of the NMOS transistor decreases as the nitrogen concentration in the gate dielectric film increases at a constant saturation current $I_{dsat}$.

On the other hand, in case of a PMOS transistor, the threshold voltage $V_{th}$ may increase due to donor traps formed by the nitrogen atoms. Also, in a saturation region, donor traps may act as scattering sources with respect to holes in the channel region, thereby lowering the saturation current $I_{dsat}$. However, as shown in FIG. 2B, the threshold voltage $V_{th}$ may increase as the nitrogen concentration in the gate dielectric film increases at a constant saturation current $I_{dsat}$.

As can be understood from the results of FIGS. 2A and 2B, when forming an oxide layer including nitrogen as a gate dielectric film, the saturation current $I_{dsat}$ of an NMOS transistor may decrease as the nitrogen concentration in the gate dielectric film increases at a constant threshold voltage $V_{th}$. As a result, the performance characteristics may be lowered as the nitrogen concentration of the gate dielectric film increases.

Figure 3:
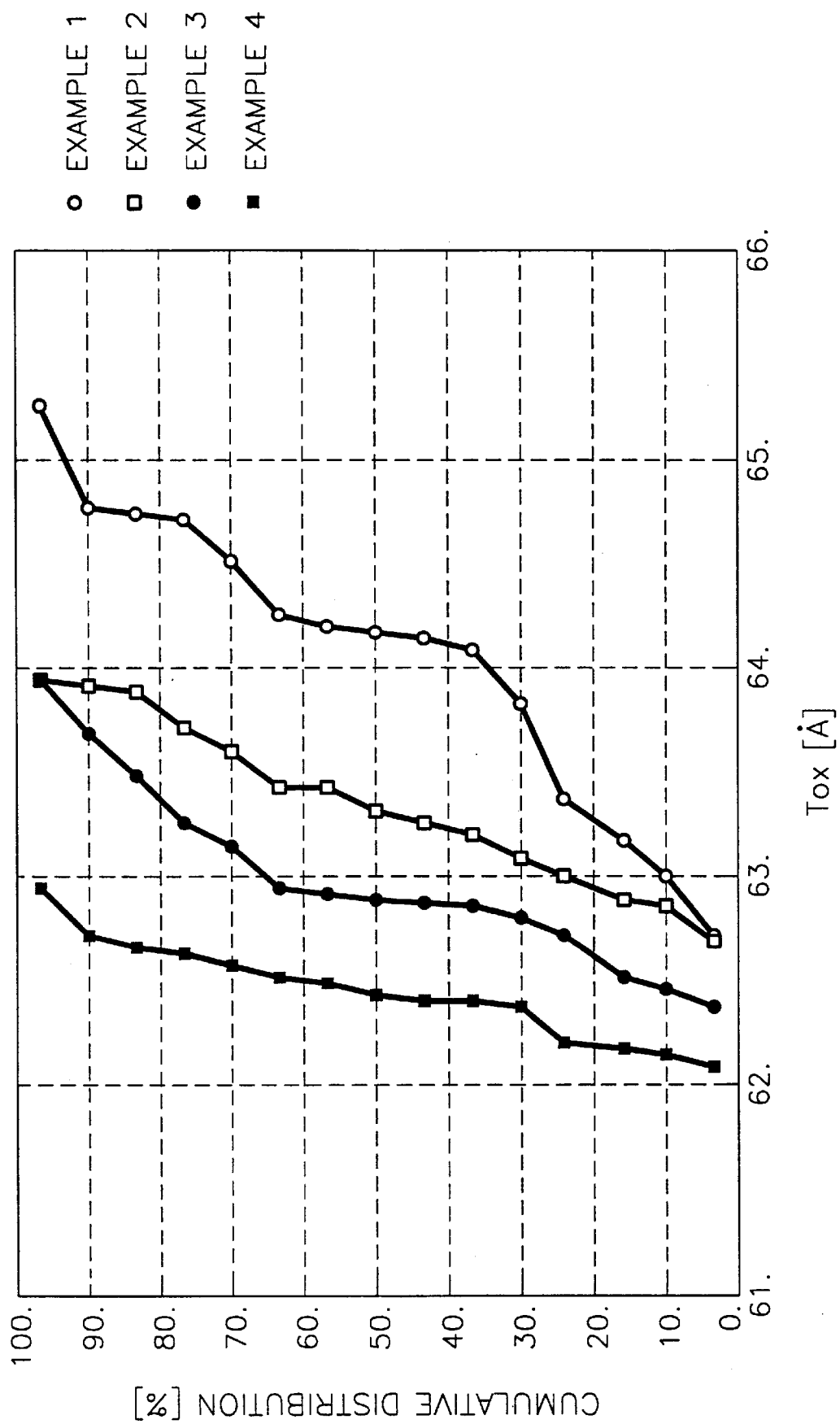
FIG. 3 is a graph showing cumulative distributions of effective oxide thicknesses of the gate dielectric films.

FIG. 3 is a graph showing the cumulative distribution of the effective oxide thickness $T_{OX}$ of each dielectric film of Examples 1 through 4. As shown in FIG. 3, the effective oxide thickness $T_{OX}$ decreases as the nitrogen concentration of the gate dielectric film increases. FIGS. 4A and 4B are graphs showing the cumulative distribution of the subthreshold swings $S_t$ in the NMOS and PMOS transistors of each example, respectively.

In general, the smaller the effective oxide thickness $T_{OX}$ is, the smaller the subthreshold swing is. However, in the NMOS transistors of FIG. 4A, the subthreshold swing $S_t$ increases as the nitrogen concentration increases, which is the opposite of the generally expected characteristics that a subthreshold swing $S_t$ decreases as effective oxide thicknesses are reduced. On the other hand, in the case of the PMOS transistor, the subthreshold swing $S_t$ decreases as the nitrogen concentration increases, as shown in FIG. 4B, which follows the generally expected characteristics.

As can be seen from the above results, the performance characteristics and the subthreshold characteristics in PMOS transistors may improve as nitrogen concentrations in the gate dielectric films increase. In case of the NMOS transistors, however, as the nitrogen concentration in the gate dielectric film increases, the saturation current at the same $V_{th}$ may be small, and the subthreshold swing may increase, thereby lowering the performance characteristics and the subthreshold characteristics.

As semiconductor devices become more highly integrated, gate dielectric films may become thinner. Accordingly, it is generally known that increasing the nitrogen concentration in gate dielectric films may increase reliability of thin gate dielectric films. In particular, it is common for a surface channel PMOS transistor to use a $p^+$ polysilicon as a gate electrode. However, this may cause a problem in that boron from the gate electrode may penetrate into the gate dielectric film. If boron penetrates into the gate dielectric film, operational characteristics of the transistor may deteriorate and reliability of the gate dielectric film may be reduced. To reduce this problem, it may be beneficial in the PMOS transistor to strengthen the gate dielectric film by increasing nitrogen concentrations therein. Also, the NMOS transistor may require a certain concentration of nitrogen in the gate dielectric film to strengthen the interface characteristic between the gate dielectric film and the silicon substrate, and to prevent penetration of boron from the gate electrode. Deterioration in performance characteristics and subthreshold characteristics may be accelerated, however, as the nitrogen concentration in the gate dielectric film increases, as discussed above.

The methods and structures of the present invention thus provide semiconductor devices having gate dielectric films whose nitrogen concentration is different in the PMOS and NMOS transistors. More particularly, nitrogen concentrations in gate dielectric films of PMOS transistors are increased to improve reliability of the gate dielectric films. Simultaneously, nitrogen concentrations of gate dielectric films of NMOS transistors are adjusted to be lower than the PMOS transistors to reduce deterioration of operational characteristics.

Figure 5A:
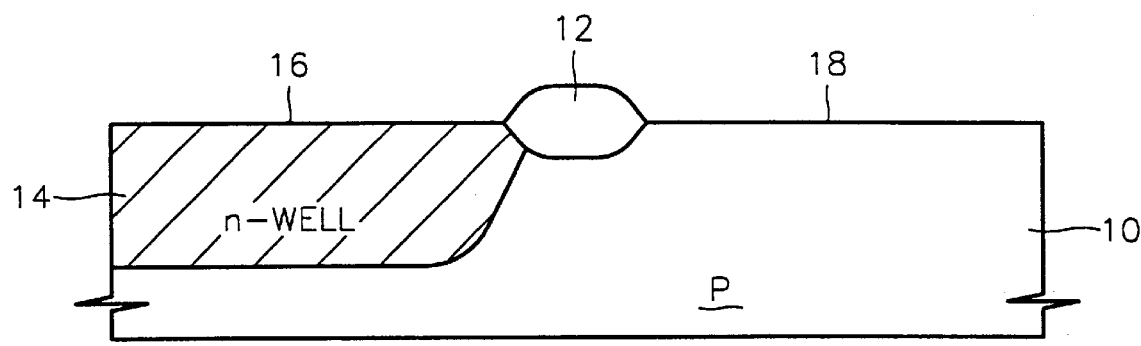
FIGS. 5A through 5G are cross sectional views illustrating methods for fabricating semiconductor devices according to a preferred embodiment of the present invention and related structures.

FIGS. 5A through 5G are cross-sectional views illustrating methods for fabricating semiconductor devices according to a preferred embodiment of the present invention. Referring to FIG. 5A, an isolation region 12 is formed on a p-type semiconductor substrate 10 to define isolation and active regions. Then phosphorous (P) ions are implanted into a selected area of the active region with a dose of $5 \times 10^{12}$ ions/cm$^2$ and an energy of 400 keV to form an n-well 14. Thus, the surface of the semiconductor substrate 10 is classified into an n-type region 16 defined by the n-well 14 and a p-type region 18 formed of the p-type semiconductor substrate 10.

Figure 5B:
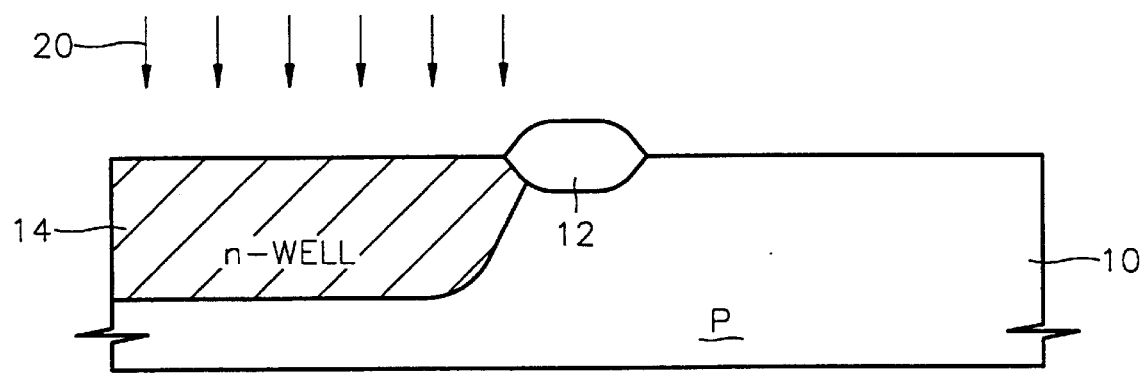

Referring to FIG. 5B, in order to adjust the threshold voltage of a PMOS transistor to be formed in the n-type region 16, arsenic (As) ions 20 are implanted into the n-well 14 in the semiconductor substrate 10 with a dose of $6 \times 10^{12}$ ions/cm$^2$ and 180 keV energy. Here, phosphorous (P) ions may be implanted instead of As ions.

Figure 5C:
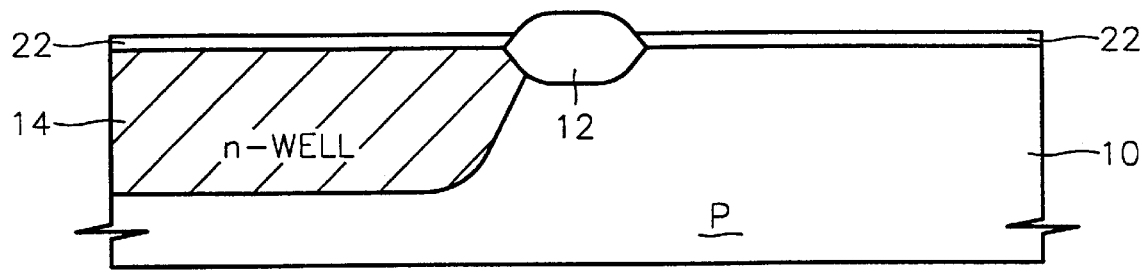
Figure 5D:
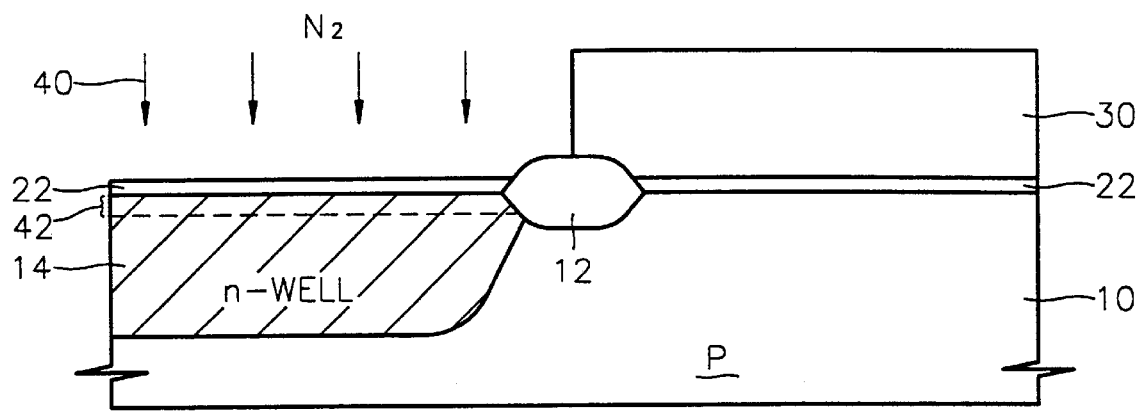
Figure 5E:
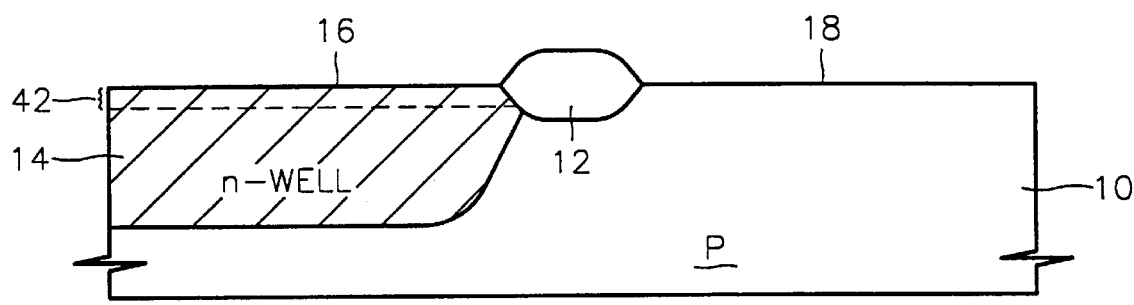

FIGS. 5C through 5E are cross-sectional views illustrating the steps of forming a nitrogen ion region 42 on the n-type region 16, near the surface of the semiconductor substrate 10. As shown in FIG. 5C, a sacrificial oxide layer 22 is formed on the entire surface of the structure having the n-type region 16 and the p-type region 18 to a predetermined thickness, for example, in the range of 80 Å to 250 Å.

Referring to FIG. 5D, a mask pattern 30, for example, a photoresist pattern, is formed exposing only the sacrificial oxide layer 22 on the n-type region 16. Nitrogen ions 40 are then implanted into the n-type region 16 using the mask pattern 30 as an ion implantation mask with a dose in the range of $1 \times 10^{13}$ to $5 \times 10^{15}$ ions/cm$^2$ and an energy in the range of 10 keV to 50 keV. As a result, a nitrogen ion region 42 is formed in the n-type region 16, near the interface between the semiconductor substrate 10 and the sacrificial oxide layer 22. The mask pattern 30 and the sacrificial oxide layer 22 are then removed as shown in FIG. 5E.

Figure 5F:
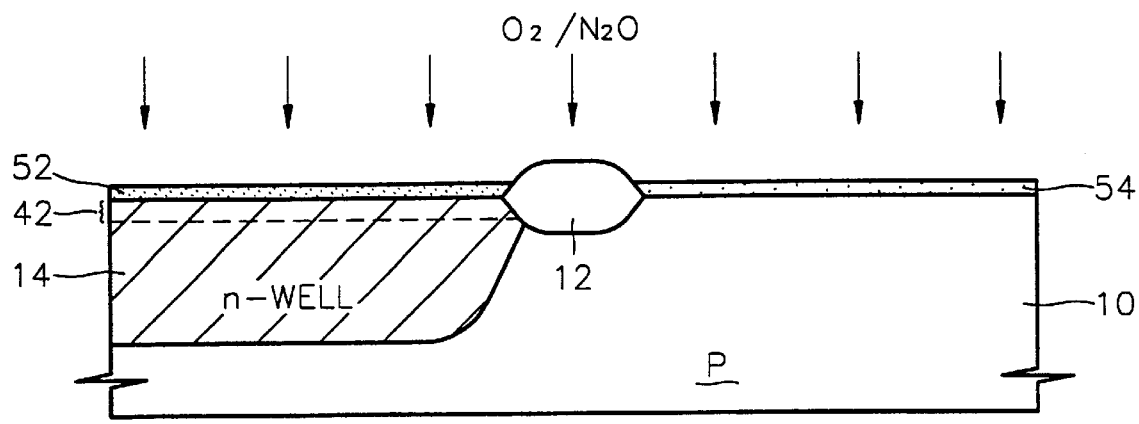

FIG. 5F is a cross-sectional view illustrating the step of forming first and second gate dielectric films 52 and 54, which are oxide layers including different concentrations of nitrogen, respectively on the n-type region 16 and the p-type region 18. Here, the first gate dielectric film 52 formed on the n-type region 16, and the second gate dielectric film 54 formed on the p-type region 18, which have different nitrogen concentrations, have a thickness in the range of approximately 10 Å to 100 Å. The first gate dielectric film 52 has a higher concentration of nitrogen than the second gate dielectric film 54, due to the nitrogen ions diffused from the nitrogen ion region 42.

To form the first and second gate dielectric films 52 and 54, exposed portions of the substrate are oxidized in a pure oxygen ($O_2$) atmosphere to form first portions of the first and second gate dielectric films 52 and 54. This oxidation step may be performed in a wet or dry condition. The first portions of the gate dielectric films can make up approximately 70% of the total thickness of the completed gate dielectric films. Then, the entire surface of the first portions is oxidized in a mixed gas condition containing nitrogen ($N_2$) and oxygen ($O_2$) (preferably in a nitrogen monoxide $N_2O$ atmosphere), to form second portions, thereby completing the first and second gate dielectric films 52 and 54. The nitrogen content in the mixed gas is preferably 5% or less based on atomic ratio.

As a result, the nitrogen content of the second gate dielectric film 54 formed on the p-type region 18 depends primarily on the nitrogen component included when the second portions of the first and second gate dielectric films 52 and 54 are formed, so that the second gate dielectric film 54 has a comparatively low nitrogen content. The first gate dielectric film 52 formed on the n-type region 16, however, has a higher nitrogen content than the second gate dielectric film 54, due to the nitrogen ions diffusing from the nitrogen ion region 42 into the girst gate dielectric film 52 and the nitrogen component included when the second portion of the gate dielectric films 52 and 54 are formed. In other words, the nitrogen content of the first gate dielectric film 52 depends primarily on diffusion from the nitrogen ion region 42 and the mixed gas used to form the second portion of the film. In contrast, the nitrogen content of the second gate dielectric film 54 depends primarily on the mixed gas used to form the second portion of the firm, and not on diffusion from the substrate.

Thus, the second gate dielectric film 54 including an appropriate concentration of nitrogen can be formed on the p-type region 18 in which an NMOS transistor is to be formed, by controlling the atomic ratio of the nitrogen in the mixed gas and nitrogen and oxygen used to form the second portions of the first and second gate dielectric films 52 and 54. Accordingly, a gate dielectric film 54 can include a reduced nitrogen concentration for increasing reliability thereof without reducing performance characteristics and subthreshold characteristics. In addition, the nitrogen ion region 42 is formed only in the n-type region where a PMOS transistor is to be formed, for securing a sufficient nitrogen content to obtaining desired operational characteristics for the PMOS transistor. In particular, a nitrogen content of the gate dielectric film 52 can be increased to a desired level without deteriorating the NMOS transistor. As a result, it is possible to form a CMOS device having NMOS and PMOS transistors both having enhanced operation characteristics.

Figure 5G:
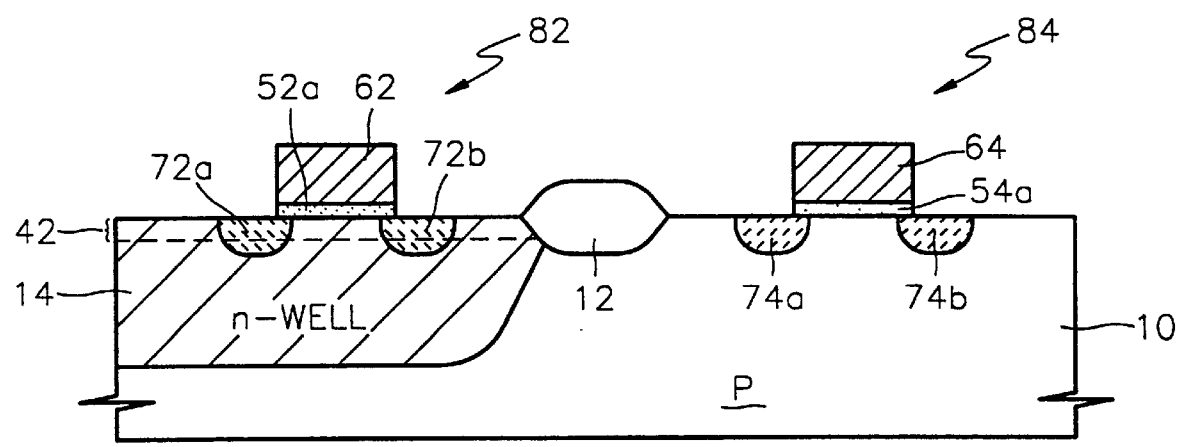

Referring to FIG. 5G, gate electrodes 62 and 64, and source/drain regions 72a, 72b, 74a, and 74b are formed on the resultant structure having the first and second gate dielectric films 52 and 54 using known techniques. A PMOS transistor 82 is thus formed including a gate dielectric film 52a having a relatively high concentration of nitrogen, and an NMOS transistor 84 is formed including a gate dielectric film 54b having a relatively low concentration of nitrogen. A CMOS transistor can then be completed through interconnection.

As described above, in the method for fabricating a CMOS transistor according to the present invention, a nitrogen ion region is formed only in an n-type region where a PMOS transistor is to be formed, near the surface of a semiconductor substrate. Gate dielectric films including oxide layers containing nitrogen are then formed on the n-type region and a p-type region at the same time under the same conditions. As a result, the gate dielectric film formed in the n-type region where the PMOS transistor is to be formed contains a higher nitrogen content than the gate dielectric film formed in the p-type region due to nitrogen ions diffusing from the nitrogen ion region.

The gate dielectric film of the PMOS transistor can thus be strengthened due to its comparatively high concentration of nitrogen, and simultaneously, the nitrogen concentration in the gate dielectric film of the NMOS transistor can be relatively reduced such that deterioration in operation characteristics of the MOS transistor, caused by increased nitrogen concentration, can be reduced. That is, in a semiconductor device according to the present invention, a gate dielectric film containing a reduced concentration of nitrogen, which is not enough to deteriorate the operation characteristics of an NMOS transistor, is formed for the NMOS transistor. Interface characteristics between the gate dielectric film of the NMOS transistor and a silicon substrate can thus be strengthened. At the same time, the nitrogen concentration in the gate dielectric film of a PMOS transistor can be increased to a desired level to increase reliability of the gate dielectric film for the PMOS transistor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electronic device on a semiconductor substrate comprising:
    a first field effect transistor on the substrate wherein the first field effect transistor includes a first gate dielectric layer having a first nitrogen concentration wherein the first field effect transistor defines a p-type channel so that the first field effect transistor is a PMOS transistor; and
    a second field effect transistor on the substrate wherein the second field effect transistor includes a second gate dielectric layer having a second nitrogen concentration lower than the first nitrogen concentration wherein the second field effect transistor defines an n-type channel so that the second field effect transistor is an NMOS transistor.

2. An electronic device according to claim 1 wherein the first gate dielectric layer comprises a first gate oxide layer having the first nitrogen concentration, and wherein the second gate dielectric layer comprises a second gate oxide layer having the second nitrogen concentration less than the first nitrogen concentration.

3. An electronic device according to claim 1 further comprising:
    a nitrogen region having an increased nitrogen concentration along a first surface portion of the substrate and wherein the first gate dielectric layer is adjacent the nitrogen region.

4. An electronic device according to claim 3 wherein a second surface portion of the substrate is free of the nitrogen region and wherein the second gate dielectric layer is adjacent the second surface portion of the substrate free of the nitrogen region.

5. An electronic device on a semiconductor substrate comprising:
    n-type and p-type regions along respective surface portions of the substrate;
    a first field effect transistor on the substrate wherein the first field effect transistor includes a first gate dielectric layer having a first nitrogen concentration wherein the first field effect transistor is a PMOS transistor with the first gate dielectric layer on the n-type region of the substrate; and
    a second field effect transistor on the substrate wherein the second field effect transistor includes a second gate dielectric layer having a second nitrogen concentration lower than the first nitrogen concentration wherein the second field effect transistor is an NMOS transistor with the second gate dielectric layer on the p-type region of the substrate.

6. An electronic device on a semiconductor substrate comprising:
    a nitrogen ion region along a first surface portion of the substrate so that the nitrogen region along the first surface portion of the substrate has an increased concentration of nitrogen with respect to a second surface portion of the substrate;
    a first field effect transistor on the first surface portion of the substrate including the nitrogen region wherein the first field effect transistor includes a first gate dielectric layer wherein the first field effect transistor defines a p-type channel so that the first field effect transistor is a PMOS transistor; and
    a second field effect transistor on the second surface portion of the substrate wherein the second field effect transistor includes a second gate dielectric layer wherein the second field effect transistor defines an N-type channel so that the second field effect transistor is an NMOS transistor wherein the second surface portion of the substrate is free of the nitrogen region so the first gate dielectric layer has a first nitrogen concentration and the second gate dielectric layer has a second nitrogen concentration lower than the first nitrogen concentration.

7. An electronic device according to claim 6 wherein the first and second gate dielectric layers have respective thicknesses in the range of 10 Å to 100 Å.

8. An electronic device according to claim 6 wherein the first surface portion of the substrate has n-type conductivity and wherein the second surface portion of the substrate has p-type conductivity.

9. A semiconductor device comprising:
   a semiconductor substrate;
   a first field effect transistor on the substrate wherein the first field effect transistor includes a first gate dielectric layer having a first nitrogen concentration; and
   a second field effect transistor on the substrate wherein the second field effect transistor includes a second gate dielectric layer having a second nitrogen concentration lower than the first nitrogen concentration;
   wherein the first field effect transistor defines a channel of a first conductivity type, wherein the second field effect transistor defines a channel of a second conductivity type, wherein the first conductivity type is p-type so that the first transistor is a PMOS transistor, and wherein the second conductivity type is n-type so that the second transistor is an NMOS transistor.

10. A semiconductor device according to claim 9 wherein the first gate dielectric layer comprises a first gate oxide layer having the first nitrogen concentration, and wherein the second gate dielectric layer comprises a second gate oxide layer having the second nitrogen concentration less than the first nitrogen concentration.

11. A semiconductor device according to claim 9 wherein the semiconductor substrate includes a nitrogen region having an increased concentration of nitrogen along a surface portion thereof adjacent the first gate dielectric layer.

12. A semiconductor device according to claim 11 wherein the semiconductor substrate is free of the nitrogen region along a surface portion thereof adjacent the second gate dielectric layer.

13. A semiconductor device comprising:
    a semiconductor substrate wherein the semiconductor substrate comprises n-type and p-type regions along a surface thereof;
    a first field effect transistor on the substrate wherein the first field effect transistor includes a first gate dielectric layer having a first nitrogen concentration wherein the first field effect transistor is a PMOS transistor with the first gate dielectric layer on the n-type region of the substrate; and
    a second field effect transistor on the substrate wherein the second field effect transistor includes a second gate dielectric layer having a second nitrogen concentration lower than the first nitrogen concentration wherein the second field effect transistor is an NMOS transistor with the second gate dielectric layer on the p-type region of the substrate.

14. A semiconductor device comprising:
    a semiconductor substrate having a transistor forming a channel of a first conductive type in a region of a second conductive type, and a transistor forming a channel of the second conductive type in a region of the first conductive type wherein the first conductive type is n-type and the second conductive type is p-type;
    a first gate dielectric film formed on the region of the first conductive type, and comprised of an oxide layer containing a first concentration of nitrogen; and
    a second gate dielectric film formed on the region of the second conductive type, and comprised of an oxide layer containing a second concentration of nitrogen lower than the first concentration.

15. The semiconductor device of claim 14, further comprising a nitrogen ion region into which nitrogen ions are implanted, formed in the region of the first conductive type, near the interface between the semiconductor substrate and the first gate dielectric film.

16. A semiconductor device having a CMOS transistor comprising a PMOS transistor formed in an n-type region of a semiconductor substrate and an NMOS transistor formed in a p-type region,
    wherein the PMOS transistor has a first gate dielectric film formed on the surface of the n-type region, and comprised of an oxide layer containing a predetermined concentration of nitrogen, and
    the NMOS transistor has a second gate dielectric film formed on the surface of the p-type region, and comprised of an oxide layer having a nitrogen concentration lower then the predetermined concentration of nitrogen in the first gate dielectric film.

* * * * *